United States Patent [19]

Moto et al.

[11] Patent Number: 5,672,210
[45] Date of Patent: Sep. 30, 1997

[54] METHOD AND APPARATUS FOR MANUFACTURING SUPERCONDUCTING COMPONENTS VIA LASER ABLATION FOLLOWED BY LASER MATERIAL PROCESSING

[75] Inventors: Akihiro Moto; Tatsuoki Nagaishi; Hideo Itozaki, all of Itami, Japan

[73] Assignee: Sumitomo Electric Industries, Ltd., Osaka, Japan

[21] Appl. No.: 517,957

[22] Filed: Aug. 22, 1995

[30] Foreign Application Priority Data

Aug. 26, 1994 [JP] Japan ................................ 6-225709

[51] Int. Cl.⁶ ........................ C23C 146/00; H01L 39/24
[52] U.S. Cl. ........................ 118/726; 427/596; 505/732; 156/345; 216/37; 216/65; 118/729; 118/730
[58] Field of Search ................................ 118/726, 729, 118/730; 427/596; 505/732; 156/345; 216/37, 65

[56] References Cited

U.S. PATENT DOCUMENTS 4,701,592  10/1987  Cheung ................................ 219/121

OTHER PUBLICATIONS

Wu, et al. Optimization of depositing $Y_1Ba_2Cu_3O_{7-\delta}$ superconducting thin films by excimer laser ablation with $CO_2$ laser–heated substrates, *Physica C* 195, (Jan. 29, 1992) pp. 241–257.

Bartholomew, Low Temperature Synthesis of High–Tc Superconducting Thin Films by Laser Assisted Reactive Deposition, Materials Research Society Extended Abstracts of High Temp Superconductors II Symposium pp. 81–84, Apr. 5–9, 1988 Reno, Nevada.

Chu, Supercond. Sci. Technol. 3 (1990) 497–499.

Tabata, Jpn. J. Appl. Phys. vol. 31 (1992) pp. 2968–2970 Part 1, No. 9B, Sep. 1992.

Kolinsky et al. 'Laser deposition and patterning of high temperature superconducting thin films' GEC JOURNAL OF RESEARCH (1988), vol. 6, No. 3, pp. 162–169.

Zheng et al. 'Laser patterning and critical current measurements of submicrometer lines of Y–Ba–Cu–O' APPLIED PHYSICS LETTERS, (Sep. 4, 1989), vol. 55, No. 10, p. 1046.

*Primary Examiner*—Richard Bueker
*Attorney, Agent, or Firm*—Beveridge, DeGrandi, Weilacher & Young, LLP

[57] ABSTRACT

The method for manufacturing superconducting elements according to the present invention include the following steps of: (a) placing a substrate near a target in a chamber so that the substrate is positioned to face a surface of the target, wherein the target comprises a target material of a complex oxide superconducting compounds; (b) irradiating a laser beam to the surface of the target to vaporize or sublime the target material so that the target material is deposited onto a surface of the substrate, wherein the surface of the substrate maintains the position facing the surface of the target; and (c) fabricating the surface of the target material layer on the substrate to form a superconducting element by irradiating a laser beam to the surface of the substrate, without removing the substrate from the chamber. The laser beam of step (b) used to irradiate may traverse along a first optical path, and the laser beam of step (c) of fabricating the surface used for the target may traverse along a second optical path, which is not consistent with the first optical path.

8 Claims, 5 Drawing Sheets

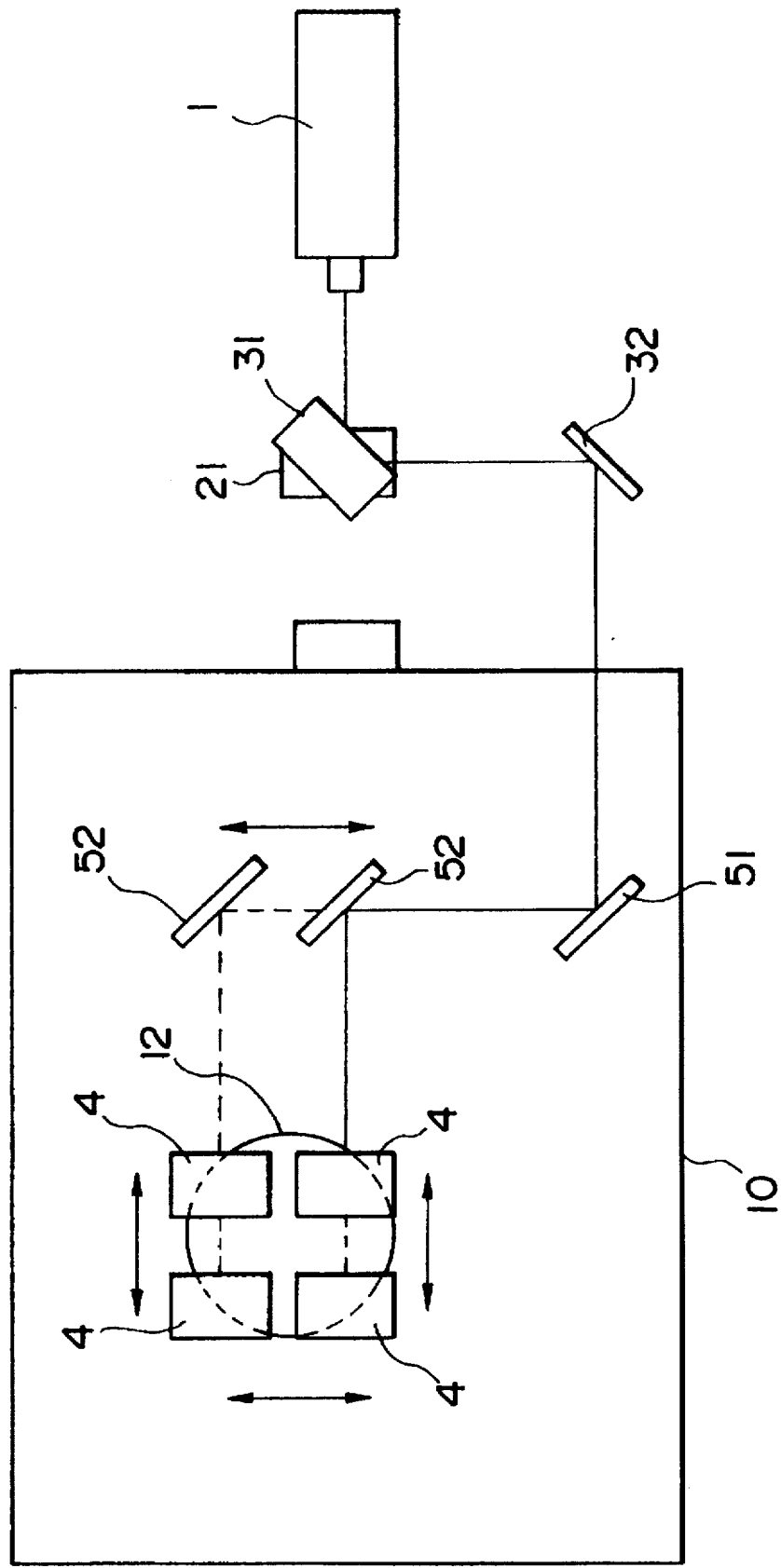

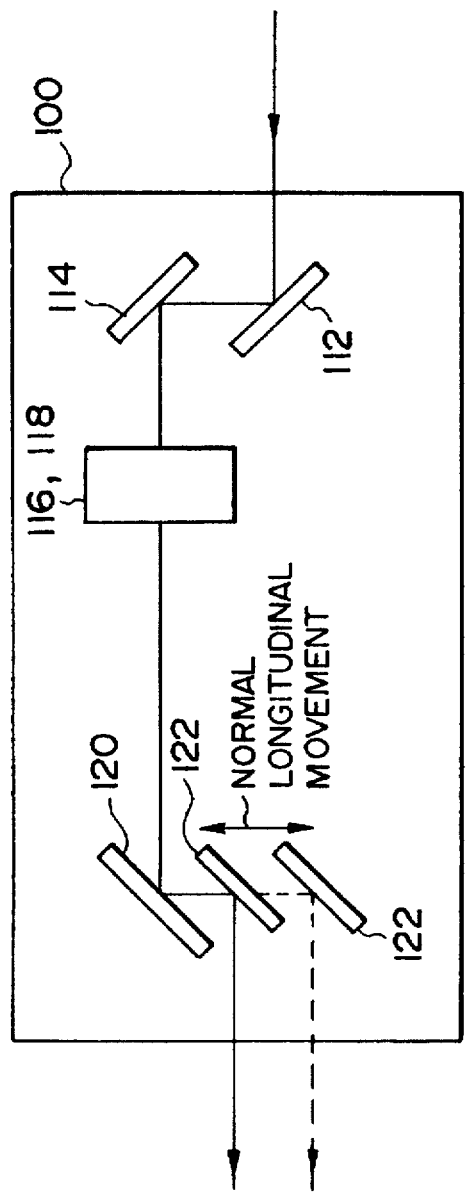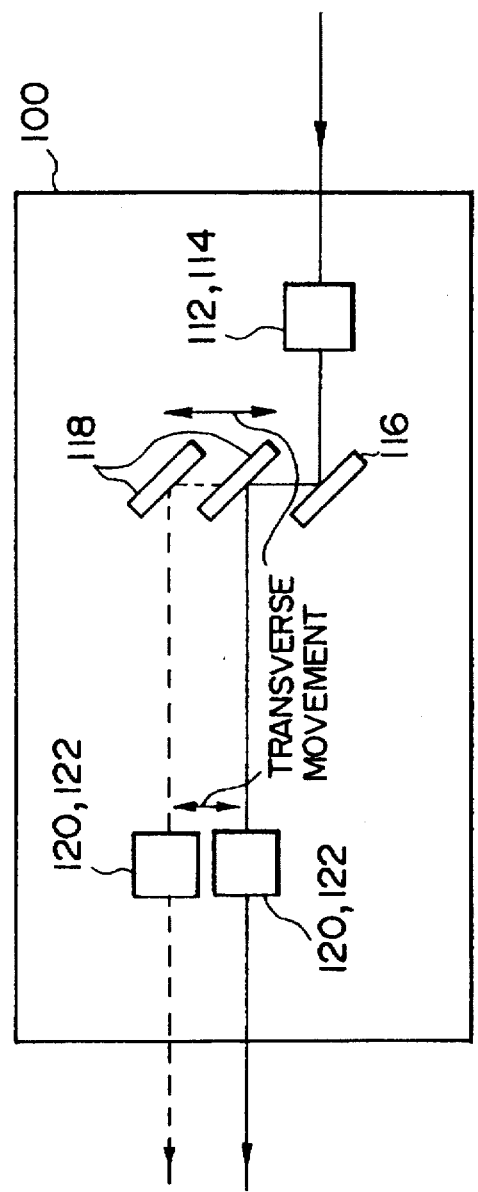

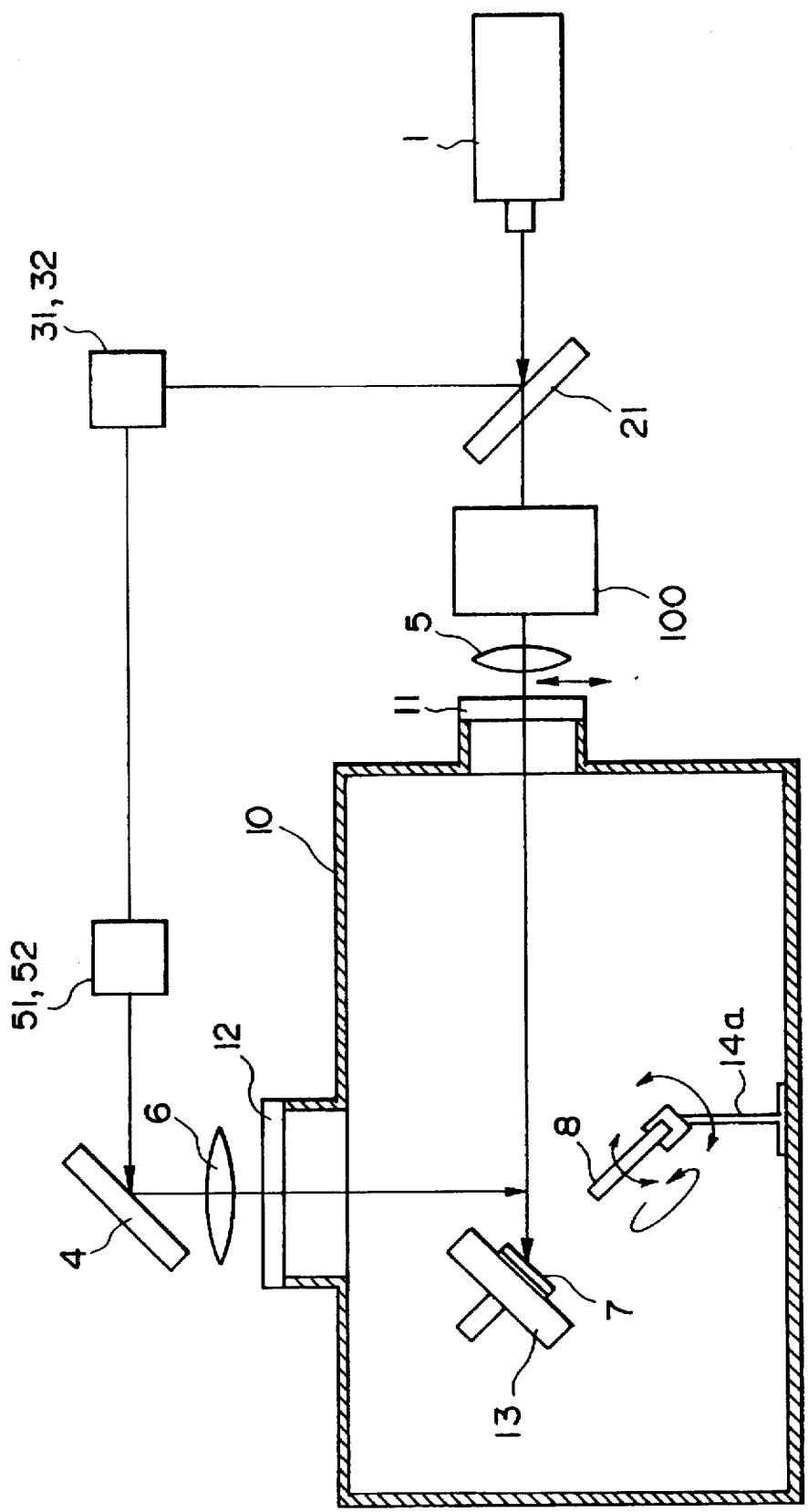

METHOD AND APPARATUS FOR MANUFACTURING SUPERCONDUCTING COMPONENTS VIA LASER ABLATION FOLLOWED BY LASER MATERIAL PROCESSING

BACKGROUND OF THE INVENTION

1. Field of The Invention

The present invention is directed to a method and an apparatus for manufacturing superconducting components. The present invention is, in particular, suitable for superconducting components which includes superconducting elements consisting of complex superconducting oxides.

2. Related Background Art

Laser ablation is one of the most suitable deposition process for obtaining excellent quality of thin films on substrates. Laser ablation process has advantages, such as excellent stoichiometric stability of deposited films, when the process is used for the films of the superconducting oxide compounds. Laser ablation also has another advantage that it does not require any electromagnetic fields, which field may possibly affect the quality of the deposited films. Therefore, laser ablation is expected to be employed as deposition process for near-term devices as it is the most promising process.

A number of studies have been made in the deposition of the superconducting films via the laser ablation process. For example, Japanese Patent No.53818/04 (Kokoku Hei 04-53818) discloses a processing method for a complex oxide superconducting film which includes a $Cu_xO_Y$ group. Other studies concerning laser ablation have been also made by, for example, Song et. al. (Appl. Phys. Lett. 63(24), pp.3370–3372, December 1993), Foltyn et. al. (Appl. Phys. Lett. 59(11), pp.1374–1376, September 1991), Linzen et. al. (Second International Conference on Macroscopic Quantum Phenomena, Smolenice Castle, Czechoslovakia, Aug. 31–Sep. 4, 1992), Krebs et. al. (J. Appl. Phys. 69(4), pp.2405–2409, February 1991), and J. A. Greer and H. J. VanHook (SPIE Proceedings Vol. 1377, November 1990).

The manufacturing process of the superconducting devices and elements, such as superconducting cables, superconducting electrodes and superconducting microwave devices, typically includes two process steps; a step of depositing superconducting material onto a substrate via laser ablation, and a step of fabricating deposited superconducting material to form devices or elements by fabrication process such as etching. Dry etching and wet etching are the typical ones used in the etching fabricating step.

Most of the etching processes, however, are carried out under the presence of photoresist and etchant, which are very active in reacting with the complex oxide superconducting compounds such as Y—Ba—Cu—O(YBCO). Therefore, it is desirable that the etching process is avoided for processing superconducting devices. Further, it is not permitted for deposited superconducting films to be exposed to the air during processing, since most of the superconducting oxides can instantly react with $H_2O$ in the air.

It is, thus, desirable to provide a manufacturing method for superconducting devices and elements, which does not include an etching process.

It is also desirable to provide a method for manufacturing superconducting devices and elements, all the steps of which do not include exposing the superconducting surfaces to the air.

SUMMARY OF THE INVENTION

The present invention satisfies these needs.

The method for manufacturing superconducting elements according to the present invention comprises the following steps of:

(a) placing a substrate near a target in a chamber so that the substrate is positioned to face a surface of the target, wherein the target comprises a target material of a complex oxide superconducting compounds;

(b) irradiating a laser beam to the surface of the target to vaporize or sublime the target material so that the target material is deposited onto a surface of the substrate, wherein the surface of the substrate maintains the position to face the surface of the target; and (c) fabricating the surface of the target material layer on the substrate to form a superconducting element by irradiating a laser beam to the surface of the substrate, without removing the substrate from the chamber.

The laser beam of the step (b) of irradiating a laser beam may traverse along a first optical path, and the laser beam of the step (c) of fabricating the surface of the target may traverse along a second optical path, which is not consistent with the first optical path.

The step (c) of fabricating the surface of the target may further include an operation of changing the position of the substrate to a position in which the substrate is generally perpendicular to the laser beam incident upon the substrate via the second optical path. The step (b) of irradiating a laser beam may further comprise an operation of scanning the incident laser beam upon the target surface, and rotating the target, so that consumption rate is equalized throughout the entire surface of the target.

In the manufacturing method according to the present invention, a superconducting layer consisting of complex oxide superconducting compounds is deposited onto a surface of a substrate by laser ablation process. A mask can be used to form the rough feature of a desired superconducting element in the laser ablation process. The deposited layer or deposited rough feature is then processed by irradiating laser beam upon the deposited layer or deposited rough feature to form into desired feature of the superconducting element. A flame-shaped "plume" (plasma) is formed upon the surface of the target which is irradiated by laser beam, and the apex of the plume contacts on the surface of the substrate so that the deposition of the superconducting oxides onto the substrate surface is carried out. Since the apex of the plume has a small size, a mask can be used to form the rough feature. In addition, the substrate or the target may be scanned to form the rough feature.

On the other hand, the laser beam used for laser ablation has considerably high energy. Thus, the laser beam can also be used for material processing such as trimming. Therefore, one laser beam source is utilized for both laser ablation and material processing. This allows to eliminate the etching process or any other process using photoresist, which reacts with superconducting oxides, from the manufacturing process of superconducting elements.

When any physical trimming of a potion of a superconducting layer is not necessary to form superconducting elements, the portion may be irradiated by high-energy laser beam so that the portion acquire electrically "non-superconducting" properties (ie., conductor, semiconductor or insulator). This method is advantageous in terms of proccessability and preciseness of the fabrication.

The apparatus for manufacturing a superconducting element according to the present invention comprises:

(i) a chamber, in which a target and a substrate holder for holding a substrate are contained, the substrate holder comprising a heater for heating the substrate, and the target comprising a complex oxide superconducting compound;

(ii) a laser beam source;

(iii) a first entrance window and a second entrance window, both of which are included in the chamber;

(iv) a first optical path from the laser beam source through the first entrance window to the target, the first optical path being used for laser ablation processing to form a complex oxide superconducting compound layer on the substrate;

(v) a second optical path from the laser beam through the second entrance window to the substrate, the second optical path being used for laser material processing of the complex oxide superconducting compound layer to form a desired superconducting element.

The first optical path may comprise a first mirror scanning system consisting of a plurality of mirrors, the mirrors being capable of synchronistically moving so that the first optical path is altered to a parallel path. The second optical path may comprise a second mirror scanning system consisting of a plurality of mirrors, the mirrors being capable of synchronistically moving so that the second optical path is altered to a parallel path.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

These and other features, aspects, and advantages of the present invention will become better understood with reference to the following description, appended claims, and accompanying drawings, where:

FIG. 2 is a plan schematic view of the processing apparatus which is shown in FIG. 1, illustrating a laser optical mirror scanning system of the processing apparatus;

FIG. 3A is a cross-sectional, side schematic view of a mirror scanner 100 of the processing apparatus shown in FIG. 1, which illustrates vertical movements of the mirrors for scanning the laser beam;

FIG. 3B is a cross-sectional, plan schematic view of the mirror scanner 100, which illustrates transverse movements of the mirrors;

FIG. 5 is a cross-sectional, side schematic view of a processing apparatus according to the present invention, illustrating a laser ablation chamber for off-axis deposition.

DESCRIPTION OF THE PREFERRED EMBODIMENTS (Processing apparatus)

With reference to FIGS. 1, 2, 3A, and 3B, we will now describe a preferable version of a substrate processing apparatus suitable for the present invention.

Figure 1:
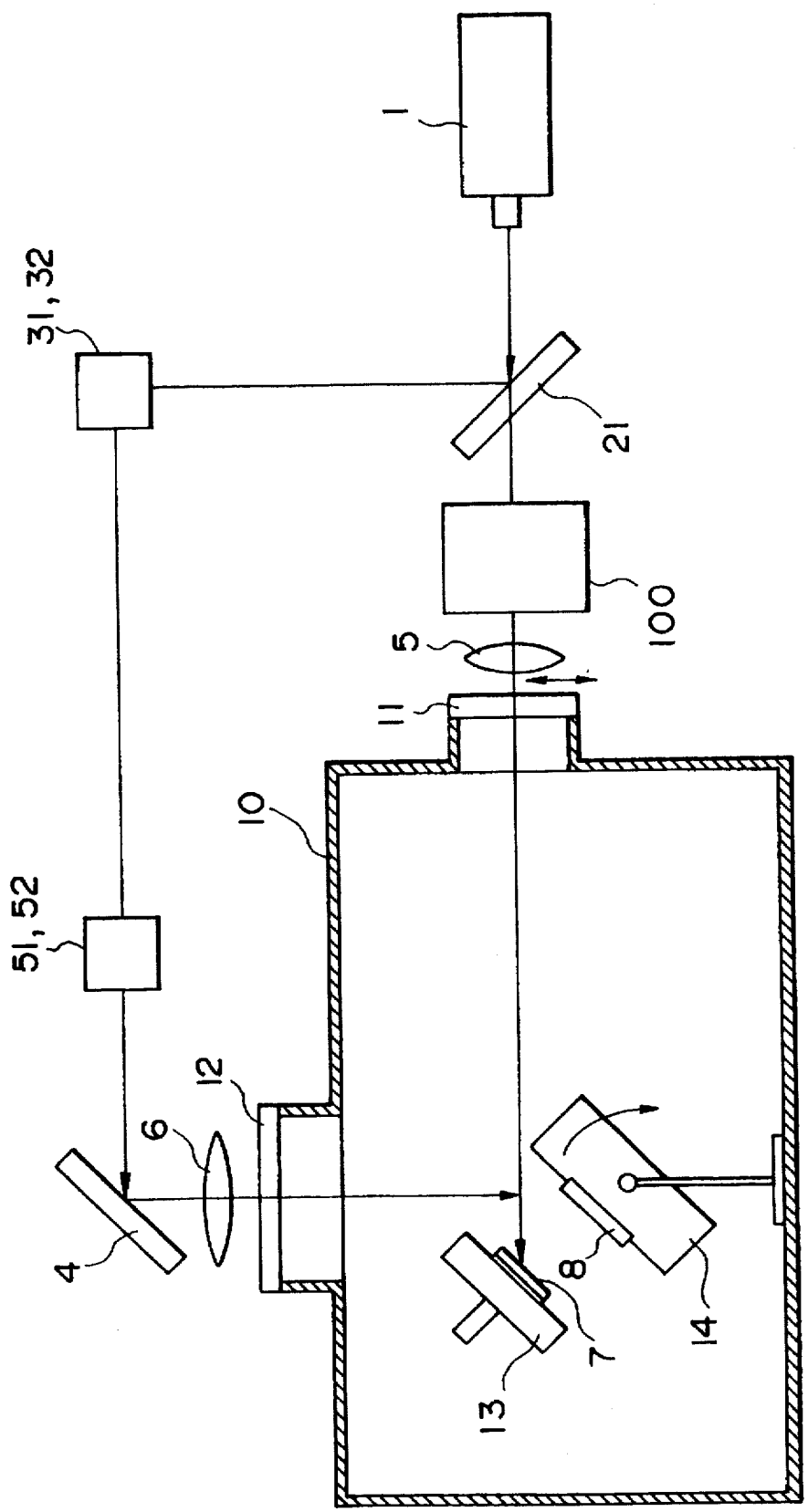
FIG. 1 is a cross-sectional, side schematic view of a processing apparatus according to the present invention, illustrating a laser ablation chamber for on-axis deposition.

Referring to the FIG. 1, the processing apparatus comprises a laser beam source 1 and a chamber 10. The pressure and the atmosphere in the chamber 10 is variable. The chamber 10 includes a target holder 13 which supports a target 7, and a substrate holder 14 supporting a substrate 8.

Laser beam source 1 is an ArF excimer laser having wavelength of 193 nm. Laser beam source includes an attenuator. Laser beam source may be KrF excimer laser having wavelength of 248 nm, or XeCl excimer laser having wavelength of 308 nm.

The target holder 13 in the chamber 10 is disposed in a position so that a exposed surface of the target 7 faces to the surface of the substrate 8 to be deposited with the target material. This configuration is referred as on-axis geometry for deposition via laser ablation.

The laser ablation apparatus further has an optical path system from the laser beam source to either of the target 7 and the substrate 8. The chamber 10 has a first entrance window 11 and a second entrance window, both of which form a part of the optical path system. The optical path system shown in FIG. 1 consists of two optical paths: (1) a first optical path from laser beam source 1 through the first entrance window to the target 7, for the purpose of laser ablation; (2) a second optical path from the laser beam source 1 to the substrate 8, for the purpose of laser material processing of the substrate.

The optical system including two optical paths will be detailed with reference to FIGS. 1, 2, 3A, and 3B.

FIG. 3A shows cross-sectional, side schematic view of a mirror scanner 100 of the processing apparatus shown in FIG. 1, which illustrates vertical movements of the mirrors for scanning the laser beam. FIG. 3B is a cross-sectional, plan schematic view of the mirror scanner 100, which illustrates transverse movements of the mirrors. The mirror scanner 100 forms a part of the first optical path. FIG. 2 shows a schematic plan view of the processing apparatus, which, in particular, illustrates a laser optical mirror scanning system of the second optical path.

(The first optical path for laser ablation deposition)

Referring now to FIG. 1, the first optical path of the processing apparatus consists of the laser beam source 1, the mirror scanner 100, the lens 5 and the first entrance window 11. The mirror 21 can move to the position sufficiently removed from the first optical path (the position not shown) so that the laser beam can be directly incident into mirror scanner 100.

The mirror scanner 100 will be described in detail below. With reference to the FIGS. 3A and 3B, the mirror scanner 100 includes six mirrors 112, 114, 116, 118, 120, and 122. Laser beam from the source 1 strikes mirror 112, and is reflected in the upward direction to reach mirror 114, as shown in FIG. 3A. Mirror 114 then reflects laser beam in path parallel to the axis to mirror 116. Referring again to FIG. 3B, the laser beam is transversely reflected by mirror 116 to mirror 118.

The mirrors 118, 120, and 122 are capable of synchronistically moving in the transverse direction, so that the optical path can be transversely altered to parallel path, as the solid line and the dotted line in FIG. 3B show. The laser beam is also capable of being altered normally, by means of normal movement of mirror 122, as the dotted line and the solid line in FIG. 3A show. Consequently, the output laser beam from mirror scanner 100 can two-dimensionally scan the entire surface of the target 7. Mirror scanner also comprises a mirror control system including servomotors for mirrors 118, 120, and 122, that allows normal and transverse movements of the mirrors described above.

The target holder 13 may be capable of rotating around an axis perpendicular to the exposed target surface, and laser beam is arranged to incident on a other point of the surface of the target 7 other than the center.

Therefore, mirror scanner 100, along with rotating target 7, allow the target material consumption to be uniform across the entire target surface, because the laser beam incident upon the target surface can be controlled to be uniform on the entire target surface area.

(The second optical path for laser material processing)

Next, the second optical path will be described in detail below, with reference to FIG. 1 and 2. FIG. 2 illustrates the top view of the second optical path.

The second optical path consists of laser beam source 1, six mirrors 21, 31, 32, 51, 52, 4; lens 6 and the second entrance window 12. All the mirrors have servomotors (not shown) for allowing necessary movements for altering laser beam, and the movements described below are suitably controlled by an external controller (not shown).

Laser beam from the source is reflected by mirror 21 in the upward direction to strike mirror 31. Laser beam is reflected, in turn, by mirror 31 in the transverse direction, by mirror 32 in the longitudinal direction, by mirror 51 in the transverse direction but reverse to the direction after mirror 31, and is incident into movable mirror 52.

Mirrors 52 and 4 are capable of synchronistically moving in the transverse direction. Mirror 4 can also move in the longitudinal direction as shown in FIG. 2. Therefore, scanning the entire superconducting surface of the substrate is achieved by these mirror movements.

Substrate holder 14 comprises a swing means (not shown). Substrate holder 14 is capable of moving as indicated by a curved arrow in FIG. 1 by the swing means, so that the surface of the substrate which has been deposited with the superconducting material via laser ablation is generally perpendicular to the laser beam through the second optical path. Therefore, the substrate position can be changed from the suitable position for on-axis laser ablation to another position suitable for laser processing. Further, laser processing can also be carried out in the chamber 10 with sufficient efficiency and preciseness, by the swing movements of the substrate holder. Thus, no substrate transfer process is necessary for further processing the superconducting material-deposited surface after the laser ablation deposition step.

Substrate holder 14 may also comprise an X-Y stage and/or rotation stage (not shown) for the substrate to move and/or rotate during the laser ablation process. Substrate 8 is positioned to a position suitable for on-axis deposition, and moved in the direction which is parallel to the surface of substrate 8, so that the entire surface of the substrate can contact the apex of the "plume" from the target. In other words, the apex of the plume from the target can scan the entire surface of the substrate by the movement of the X-Y stage and/or rotation stage, when mirror scanner 100 can not scan sufficiently large area of the surface of target 7 or when the processing apparatus does not include mirror scanner 100 Therefore, the superconducting material layer can be formed with an uniform layer thickness across the entire surface of the substrate.

Substrate holder 14 further has a heating means, which heats the substrate 8 to a desired temperature.

Target holder 13 further has a rotating means, which rotates itself and the target 7.

EXAMPLE

A superconducting microstrip line device was prepared, in the manner described below.

Figure 4:
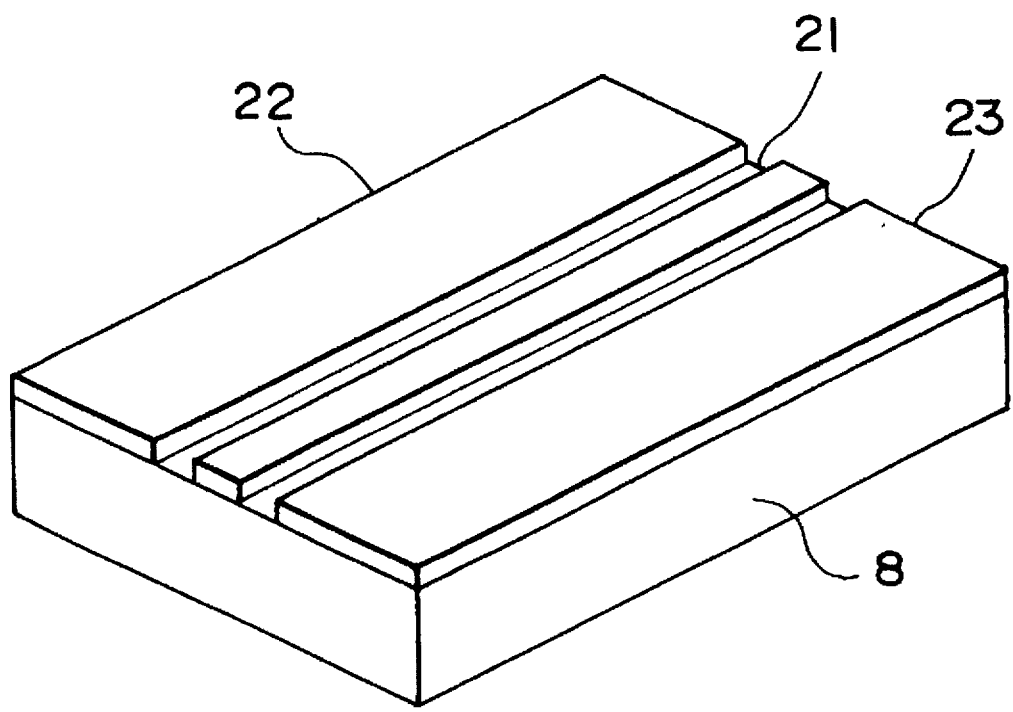
FIG. 4 is a perspective view of superconducting microstrip line device, which was fabricated in the Example.

The substrate processing apparatus was employed for the preparation of the superconducting microstrip line device according to the present invention. FIG. 4 represents the superconducting microstrip line device prepared in the Example. Referring now to FIG. 4, the superconducting microstrip line device comprises substrate 8, superconducting line conductor 21 formed on substrate 8, superconducting grounded conductors 22 and 23 disposed respectively in parallel in each outer side of superconducting line conductor 21.

Superconducting line conductor 21 has a width of 100 μm and a length of 12 mm, and superconducting grounded conductors 22 and 23 have a width of 5.9 mm and a length of 12 mm. $Y_1Ba_2Cu_3O_{7-x}$ oxide superconducting material was employed for the material for superconducting line conductor 21 and superconducting grounded conductors 22 and 23. A MgO single crystalline substrate was employed for substrate 8, and a sintered $Y_1Ba_2Cu_3O_{7-x}$ having a diameter of 2 cm was also employed for target 7.

Prior to processing, $Y_1Ba_2Cu_3O_{7-x}$ target 7 was positioned into target holder 13, and MgO substrate 8 was positioned into substrate holder 14. Chamber 10 was evacuated to $1 \times 10^{-6}$ Torr. $O_2$ gas was introduced in the evacuated chamber 10 to give the chamber pressure of 400 mTorr. The distance between substrate 8 and target 7 was 7 cm, and substrate 8 was heated by the heating means of substrate holder 14 to a temperature of 700° C. Laser beam source of the present Example was a ArF excimer laser having a wavelength of 193 nm. Laser beam energy was controlled to be 3.5 J/cm$^2$, laser beam irradiating area on the surface of target 7 was $2 \times 4$ mm$^2$, and the pulse frequency was 5 Hz. Target 7 was rotated at a rotating rate of about 15 r.p.m.

Mirror 21 was removed from any position to disturb the first optical path, and laser beam incidents onto target 7 via the first optical path. Then laser ablation processing was carried out, with a laser beam being introduced onto the target 7. Mirror scanner 100 was also operated to give two-dimensional movement to the laser beam incidence onto target 7.

The laser beam was traversed from laser beam source 1, through mirror scanner 100, lens 5 and first entrance window 11, to target 7, as shown in FIG. 1, and target material was vaporized to form plume. Vaporized target material was deposited onto the exposed surface of the substrate 8 which was disposed in an on-axis position to target 7, and a superconducting layer was formed to a thickness of 500 nm. The laser ablation processing was completed and power supplying to laser beam source 1 was then stopped.

Next, Oxygen gas was introduced into chamber 10 to atmospheric pressure, and the processing apparatus was left unoperated until the substrate was naturally cooled down to a temperature of less than 200° C. Mirror 21 was disposed in the position shown in FIG. 1 to reflect laser beam to the second optical path for laser material processing. Substrate holder 14 was then swung to the position in which the surface of substrate 8 was generally perpendicular to laser beam via second entrance window 12. Chamber 10 was again evacuated to $1 \times 10^6$ Torr, and power was supplied to laser beam source 1. Laser beam traversed along second optical path, which consisted of six mirrors 21, 31, 32, 51, 52, 4; lens 6; and second entrance window.

During laser material processing, the laser optical mirror scanning system in the second optical path was operated to allow scanning the surface of the substrate 8. The laser optical mirror scanning system consists of mirrors 52 and 4, which synchronistically moved as mentioned above when referring to FIG. 2 to give scanning entire surface of substrate. The scanning was controlled by an external controller (not shown), and the pattern shown in FIG. 4 was made by laser material processing.

The second optical path had an optical imaging of 20:1, and slit (not shown) of 2 mm×1 mm was used to reduce the opening of laser beam source 1. Laser energy of the laser material processing was 1.5 J/cm², irradiating area on the surface of substrate 8 was 100 μm×50 μm, and pulse frequency was 10 Hz. Mirrors 52 and 4 synchronistically moved as mentioned above. Laser pulse irradiation per one point of substrate surface was set to 20 times, and scanning by the movement of mirrors 52 and 4 was made by 95 μm pitch, and superconducting line conductor 21, superconducting grounded conductors 22 and 23 were formed as shown in FIG. 4 to form the microstrip line device.

The signal loss of the microstrip line device prepared in the present example was measured at the temperature of 77.3K by using the network analyzer(HP 8510B, commercially available from Hewlett Packard Co.), and comparison was made with a conventional microstrip line device. The cryostat was used with liquid nitrogen for the measurements under the low temperature condition.

The signal loss through the microstrip line device according to the present invention was 0.1 dB at a frequency of not more than 10 GHz, while the signal loss of the microstrip line device by the conventional photolithography method was 0.3 dB at the same frequency.

Therefore, it was shown that the superconducting microstrip line device according to the present invention presents lower signal loss than conventional superconducting microstrip line devices.

Alternative examples according to the present invention were also carried out, by replacing ArF excimer laser beam source 1 to KrF excimer laser beam source 1 having wave length of 248 nm, and to XeCl excimer laser beam source 1 having wavelength of 308 nm. Similar results of the formed microstrip line devices were obtained in these alternative examples. Therefore, it was shown that both a KrF excimer laser beam source 1 having wave length of 248 nm, and a XeCl excimer laser beam source 1 having wavelength of 308 nm are also useful for the manufacturing process according to the present invention.

The manufacturing method and the apparatus according to the present invention are not limited to on-axis laser deposition geometry, and are applicable to off-axis geometry, as illustrated in FIG. 5. Referring to FIG. 5, the chamber 10 includes a substrate holder 14a, which is suitable for off-axis deposition. Substrate holder 14a holds substrate 8 so that both surfaces of substrate 8 are generally perpendicular to the surface of target 7. Target material can be deposited onto both surfaces of the substrate 8 when the off-axis geometry is used for the laser ablation of complex superconducting oxides.

Substrate holder 14a is capable of various movements, in order to obtain uniformity of the deposited superconducting material layer. First, substrate holder 14a has a rotation stage, to rotate substrate 8 in a direction parallel to the surface of substrate 8. The rotation achieves the thickness uniformity across the entire superconducting layer.

Substrate holder 14a may comprise a swing means (not shown), and can swing substrate 8 to a position that the surface of substrate 8 is perpendicular to a laser beam through the second entrance window 12. This position of substrate 8 allows the deposited surfaces of substrate 8 to be precisely and effectively fabricated.

Further, substrate holder 14a may comprise a means for turning substrate 8 around, to allow both surfaces of substrate 8 to be fabricated by laser material processing by the second optical path including second entrance window 12. A heater is also provided to substrate holder 14a.

Although the present invention has been described in considerable detail with reference to certain preferred versions, many other versions should be apparent to those skilled in the art. For example, the target material may be selected from other complex superconducting oxides such as $TlBa_2CaCu_2O_x$, $Tl_2Ba_2Ca_2Cu_3O_x$, or $Bi_2Sr_2CaCu_2O_x$. Further, the substrate 8 may be $LaAlO_3$ having (100) plane, sapphire ($Al_2O_3$) having R plane or $SrTiO_3$. Therefore, the spirit and the scope of the appended claims should not be limited to the description of the preferred versions contained herein.

The basic Japanese Application No. 225709/1994 filed on Aug. 26, 1994 is hereby incorporated by reference.

What is claimed is:

1. An apparatus for manufacturing a superconducting device which has a superconductor film of a complex oxide superconducting compound, said apparatus comprising:

(i) means defining a chamber, (ii) a target holder for holding a target including a complex oxide superconducting compound;

(iii) a substrate holder for holding a substrate contained within said chamber, said substrate holder including a heater for heating the substrate held by said substrate holder, and means for moving said substrate holder between a first substrate position and a second substrate position, wherein a surface of the substrate held by said substrate holder, on which surface the superconductor film is deposited, faces toward and is generally parallel to a surface of the target held by said target holder when said substrate holder is in said first substrate position, and wherein the surface of the substrate held by said substrate holder is perpendicular to a laser beam via a second optical path when said substrate holder is in said second substrate position;

(iv) a laser beam source for supplying said laser beam;

(v) a first entrance window and a second entrance window for said chamber;

(vi) a first optical path from said laser beam source through said first entrance window to the target held by said target holder, said first optical path being used for laser ablation processing to form a complex oxide superconducting compound layer on the substrate; and (vii) said second optical path being from said laser beam source through said second entrance window to the substrate held by said substrate holder, said second optical path being used for laser patterning of the complex oxide superconducting compound layer formed using said first optical path to form desired superconducting devices.

2. An apparatus according to claim 1, wherein said first optical path comprises a first mirror scanning system consisting of a plurality of mirrors, said mirrors of said first optical path being capable of synchronistically moving so that said laser beam can be scanned by said first optical path.

3. An apparatus according to claim 1, wherein said second optical path comprises a second mirror scanning system consisting of a plurality of mirrors, said mirrors of said second optical path being capable of synchronistically moving so that said laser beam can be scanned by said second optical path.

4. An apparatus according to claim 1, wherein said substrate holder is capable of rotating in a direction parallel to a surface of the substrate held by said substrate holder.

5. An apparatus according to claim 1, wherein said substrate holder moves in two directions parallel to the surface of the substrate held thereon.

6. An apparatus according to claim 1, wherein said target holder rotates about an axis perpendicular to the surface of the target held thereon.

7. An apparatus according to claim 1, wherein said substrate holder rotates in a plane parallel to the surface of the substrate held thereon.

8. An apparatus according to 1, wherein said substrate holder has a base and is capable of rotation and pivoting about said base thereof.

* * * * *